(12) United States Patent
Lee

(10) Patent No.: US 10,897,812 B2
(45) Date of Patent: Jan. 19, 2021

(54) COMPONENT CARRIER HAVING A COMPONENT SHIELDING AND METHOD OF MANUFACTURING THE SAME

(71) Applicant: AT&S (Chongqing) Company Limited, Chongqing (CN)

(72) Inventor: Minwoo Lee, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 0 days.

(21) Appl. No.: 16/726,288

(22) Filed: Dec. 24, 2019

(65) Prior Publication Data

US 2020/0205280 A1 Jun. 25, 2020

(30) Foreign Application Priority Data

Dec. 25, 2018 (CN) .......................... 2018 1 1591034

(51) Int. Cl.
*H05K 1/18* (2006.01)
*H05K 1/02* (2006.01)
*H05K 3/46* (2006.01)

(52) U.S. Cl.
CPC ......... *H05K 1/0219* (2013.01); *H05K 1/0206* (2013.01); *H05K 1/0209* (2013.01); *H05K 1/185* (2013.01); *H05K 3/4644* (2013.01)

(58) Field of Classification Search
CPC ...... H05K 1/185; H05K 1/183; H05K 1/0203; H05K 1/0204; H05K 1/0206; H05K 1/0207; H05K 1/02; H05K 1/0209; H05K 1/021
See application file for complete search history.

(56) References Cited

U.S. PATENT DOCUMENTS

| 5,438,451 | A | 8/1995 | Schweizer |
| 5,734,555 | A | 3/1998 | McMahon |
| 6,337,228 | B1 | 1/2002 | Juskey et al. |
| 6,507,102 | B2 | 1/2003 | Juskey et al. |
| 6,709,897 | B2 | 3/2004 | Cheng et al. |
| 6,975,954 | B2 | 12/2005 | Mak et al. |

(Continued)

FOREIGN PATENT DOCUMENTS

| AR | 091439 A1 | 2/2015 |
| AU | 2001001 A | 6/2001 |

(Continued)

OTHER PUBLICATIONS

Mahajan, R. et al.; Embedded Multi-Die Interconnect Bridge (EMIB)—a High Density, High Bandwidth Packaging Interconnect; Assembly Test Technology Development, Feb. 2016; pp. 1-9; Intel Corporation; Chandler, AZ, U.S.A.

(Continued)

*Primary Examiner* — Jeremy C Norris
(74) *Attorney, Agent, or Firm* — Robert A. Blaha; Smith Tempel Blaha LLC

(57) ABSTRACT

A component carrier and a method of manufacturing the same are disclosed. The component carrier has a stack with at least one electrically conductive layer structure and/or at least one electrically insulating layer structure, and a component embedded in the stack. Sidewalls of the component are directly covered with an electrically conductive layer. The component carrier achieves enhanced thermal dissipation and EMI shielding characteristics and has an improved stiffness.

15 Claims, 8 Drawing Sheets

(56) References Cited

U.S. PATENT DOCUMENTS

| | | |
|---|---|---|
| 7,005,681 B2 | 2/2006 | Bader et al. |
| 7,087,845 B2 | 8/2006 | Tohkairin et al. |
| 7,279,252 B2 | 10/2007 | Aschke et al. |
| 7,317,622 B2 | 1/2008 | Li |
| 7,379,306 B2 | 5/2008 | Sawatari et al. |
| 7,528,482 B2 | 5/2009 | Huang et al. |
| 7,580,269 B2 | 8/2009 | Li |
| 8,105,874 B2 | 1/2012 | Gruber et al. |
| 8,227,904 B2 | 7/2012 | Braunisch et al. |
| 8,314,343 B2 | 11/2012 | Inoue et al. |
| 8,432,022 B1 | 4/2013 | Huemoeller et al. |
| 8,785,034 B2 | 7/2014 | Forster et al. |
| 8,811,019 B2 | 8/2014 | Gottwald et al. |
| 8,872,349 B2 | 10/2014 | Chiu et al. |
| 8,901,748 B2 | 12/2014 | Manusharow et al. |
| 8,916,981 B2 | 12/2014 | Xiu et al. |
| 8,946,900 B2 | 2/2015 | Qian et al. |
| 9,101,075 B2 | 8/2015 | Naganuma et al. |
| 9,113,573 B2 | 8/2015 | Liu |
| 9,119,313 B2 | 8/2015 | Zhang et al. |
| 9,142,475 B2 | 9/2015 | Skinner et al. |
| 9,147,638 B2 | 9/2015 | Liu et al. |
| 9,147,663 B2 | 9/2015 | Liu et al. |
| 9,171,816 B2 | 10/2015 | Teh et al. |
| 9,190,380 B2 | 11/2015 | Teh et al. |
| 9,202,803 B2 | 12/2015 | Zhang et al. |
| 9,232,647 B2 | 1/2016 | Gottwald |
| 9,236,366 B2 | 1/2016 | Roy et al. |
| 9,257,666 B2 | 2/2016 | Sirringhaus et al. |
| 9,275,955 B2 | 3/2016 | Mahajan et al. |
| 9,275,971 B2 | 3/2016 | Chiu et al. |
| 9,324,901 B2 | 4/2016 | Förster et al. |
| 9,343,389 B2 | 5/2016 | Skinner et al. |
| 9,379,490 B2 | 6/2016 | Schweizer |
| 9,412,625 B2 | 8/2016 | Liu |
| 9,437,569 B2 | 9/2016 | Teh et al. |
| 9,508,636 B2 | 11/2016 | Zhang et al. |
| 2004/0259299 A1 | 12/2004 | Bader et al. |
| 2005/0285253 A1 | 12/2005 | Takashi |
| 2006/0145331 A1* | 7/2006 | Cho .................. H01L 24/82 257/700 |
| 2006/0220167 A1 | 10/2006 | Min et al. |
| 2008/0149379 A1* | 6/2008 | Nagase ............. H01L 23/5389 174/260 |
| 2009/0296310 A1* | 12/2009 | Chikara ................ H01G 2/065 361/301.4 |
| 2009/0321118 A1 | 12/2009 | Kim et al. |
| 2010/0313940 A1 | 12/2010 | Wehrspohn et al. |
| 2011/0133732 A1 | 6/2011 | Sauber |
| 2011/0229073 A1 | 9/2011 | Sirringhaus et al. |
| 2011/0278703 A1 | 11/2011 | Pagaila et al. |
| 2013/0048361 A1* | 2/2013 | Yamashita ........ H01L 23/49822 174/260 |
| 2013/0199829 A1 | 8/2013 | Gottwald |
| 2014/0145565 A1 | 5/2014 | Gottwald et al. |
| 2014/0199890 A1 | 7/2014 | Schweizer |
| 2015/0364423 A1 | 12/2015 | Liu et al. |
| 2016/0014901 A1 | 1/2016 | Gottwald et al. |
| 2016/0020194 A1 | 1/2016 | Gottwald et al. |
| 2016/0085899 A1 | 3/2016 | Qian et al. |
| 2016/0133552 A1 | 5/2016 | Roy et al. |
| 2016/0155705 A1 | 6/2016 | Mahajan et al. |
| 2016/0204049 A1 | 7/2016 | Chiu et al. |
| 2016/0336258 A1 | 11/2016 | Liu |
| 2017/0086307 A1 | 3/2017 | Thomas et al. |
| 2017/0127524 A1 | 5/2017 | Gottwald et al. |
| 2017/0148746 A1 | 5/2017 | Chiu et al. |

FOREIGN PATENT DOCUMENTS

| | | |
|---|---|---|
| AU | 2003274094 A1 | 6/2004 |
| CA | 2242162 A1 | 7/1997 |
| CA | 2872732 A1 | 12/2013 |
| CH | 322584 A | 6/1957 |
| CH | 322684 A | 6/1957 |
| CH | 648 978 A5 | 4/1985 |
| CH | 666 155 A5 | 6/1988 |
| CH | 666 376 A5 | 7/1988 |
| CH | 704 988 A1 | 12/2012 |
| CN | 1208362 A | 2/1999 |
| CN | 1781155 A | 5/2006 |
| CN | 101233458 A | 7/2008 |
| CN | 101258787 A | 9/2008 |
| CN | 102763494 A | 10/2012 |
| CN | 102948266 A | 2/2013 |
| CN | 103339726 A | 10/2013 |
| CN | 103814629 A | 5/2014 |
| CN | 103931052 A | 7/2014 |
| CN | 104037161 A | 9/2014 |
| CN | 104040767 A | 9/2014 |
| CN | 104051420 A | 9/2014 |
| CN | 104124229 A | 10/2014 |
| CN | 104733436 A | 6/2015 |
| CN | 105164798 A | 12/2015 |
| CN | 105190871 A | 12/2015 |
| CN | 106416435 A | 2/2017 |
| DE | 42 32 079 A1 | 3/1994 |
| DE | 42 320 77 A1 | 3/1994 |
| DE | 44 16 403 A1 | 11/1995 |
| DE | 44 16 403 C2 | 11/1995 |
| DE | 195 13 721 A1 | 10/1996 |
| DE | 195 32 992 A1 | 3/1997 |
| DE | 196 00 967 A1 | 7/1997 |
| DE | 94 22 341 U1 | 5/2000 |
| DE | 100 18 419 A1 | 10/2001 |
| DE | 199 58 644 A1 | 10/2001 |
| DE | 101 42 653 A1 | 4/2003 |
| DE | 202 20 468 U1 | 11/2003 |
| DE | 102 52 308 B3 | 4/2004 |
| DE | 103 02 342 A1 | 8/2004 |
| DE | 103 19 271 A1 | 11/2004 |
| DE | 103 31 453 A1 | 2/2005 |
| DE | 103 35 805 A1 | 3/2005 |
| DE | 10 2004 062 441 B3 | 7/2006 |
| DE | 10 2005 032 489 B3 | 11/2006 |
| DE | 201 22 678 U1 | 3/2007 |
| DE | 10 2005 047 025 A1 | 4/2007 |
| DE | 20 2007 003 815 U1 | 5/2007 |
| DE | 10 2006 004 322 A1 | 8/2007 |
| DE | 10 2007 011 811 A1 | 10/2008 |
| DE | 10 2009 060 480 A1 | 6/2011 |
| DE | 10 2010 018 499 A1 | 10/2011 |
| DE | 10 2010 060 855 A1 | 5/2012 |
| DE | 20 2010 017 772 U1 | 10/2012 |
| DE | 20 2010 017 809 U1 | 11/2012 |
| DE | 20 2011 110 023 U1 | 11/2012 |
| DE | 10 2011 105 346 A1 | 12/2012 |
| DE | 20 2011 110 068 U1 | 12/2012 |
| DE | 20 2011 110 070 U1 | 12/2012 |
| DE | 10 2011 051 411 A1 | 1/2013 |
| DE | 102012110000 A1 | 5/2013 |
| DE | 10 2012 110 832 A | 5/2014 |
| DE | 11 2012 004 832 T5 | 8/2014 |
| DE | 10 2013 102 048 A1 | 9/2014 |
| DE | 10 2013 102 541 A1 | 9/2014 |
| DE | 10 2013 102 542 A1 | 9/2014 |
| DE | 21 2013 000 058 U1 | 9/2014 |
| DE | 10 2014 108 992 A | 12/2014 |
| DE | 10 2014 108 992 A1 | 12/2014 |
| DE | 10 2014 007 429 A1 | 11/2015 |
| DE | 10 2014 008 148 A1 | 11/2015 |
| DE | 10 2015 113 322 B3 | 11/2016 |
| DE | 10 2015 113 324 A1 | 2/2017 |
| DE | 10 2015 113 503 A1 | 2/2017 |
| DE | 10 2015 118 146 B4 | 6/2017 |
| DE | 102015118146 B4 | 6/2017 |
| EP | 1 450 182 A2 | 8/2004 |
| EP | 1 461 706 A1 | 9/2004 |
| EP | 1 480 269 A1 | 11/2004 |
| EP | 1 592 288 A1 | 11/2005 |
| EP | 1 618 570 A2 | 1/2006 |
| EP | 1 900 264 A1 | 3/2008 |
| EP | 1 910 901 A1 | 4/2008 |

(56) References Cited

FOREIGN PATENT DOCUMENTS

| | | |
|---|---|---|
| EP | 1 461 706 B1 | 5/2009 |
| EP | 2 191 516 A1 | 6/2010 |
| EP | 2 356 709 A1 | 8/2011 |
| EP | 2 415 332 B1 | 2/2012 |
| EP | 2 561 729 A1 | 2/2013 |
| EP | 2 674 964 A1 | 12/2013 |
| EP | 2 747 136 A1 | 6/2014 |
| EP | 2 808 891 A1 | 12/2014 |
| EP | 2 811 239 A1 | 12/2014 |
| EP | 2 814 306 A1 | 12/2014 |
| ES | 2 391 130 T3 | 11/2012 |
| ES | 2 523 141 T3 | 11/2014 |
| GB | 2521752 A | 7/2015 |
| JP | 2004228563 A | 8/2004 |
| JP | 2006524905 A | 11/2006 |
| JP | 2008545260 A | 12/2008 |
| JP | 2009503487 A | 1/2009 |
| JP | 2012238874 A | 12/2012 |
| JP | 2013526024 A | 6/2013 |
| JP | 6194579 B2 | 6/2014 |
| JP | 2014140022 A | 7/2014 |
| JP | 2015502635 A | 1/2015 |
| JP | 2015526884 A | 9/2015 |
| JP | 5876093 B2 | 3/2016 |
| JP | 2016048795 A | 4/2016 |
| JP | 2017004935 A | 1/2017 |
| JP | 2017117801 A | 6/2017 |
| KR | 20140098808 A | 8/2014 |
| KR | 20140113467 A | 9/2014 |
| KR | 20160025536 A | 3/2016 |
| KR | 101744466 B1 | 6/2017 |
| PT | 2191516 E | 10/2012 |
| RU | 2 532 896 C2 | 1/2013 |
| RU | 2011 127 234 A | 1/2013 |
| TW | I3536085 | 5/1997 |
| TW | I353650 B | 12/2011 |
| TW | 201408823 A | 3/2014 |
| TW | 201442201 A | 11/2014 |
| TW | 201501259 A | 1/2015 |
| WO | 9725127 A1 | 7/1997 |
| WO | 9957951 A1 | 11/1999 |
| WO | 0143514 A1 | 6/2001 |
| WO | 0249103 A2 | 6/2002 |
| WO | 03026029 A1 | 3/2003 |
| WO | 2004045260 A1 | 5/2004 |
| WO | 2005011345 A1 | 2/2005 |
| WO | 2006063822 A2 | 6/2006 |
| WO | 2007012939 A1 | 2/2007 |
| WO | 2007087982 A1 | 8/2007 |
| WO | 2008110402 A1 | 9/2008 |
| WO | 2009033466 A1 | 3/2009 |
| WO | 2010151350 A1 | 12/2010 |
| WO | 2011131362 A1 | 10/2011 |
| WO | 2012175184 A1 | 12/2012 |
| WO | 2012175207 A2 | 12/2012 |
| WO | 2013000574 A1 | 1/2013 |
| WO | 2013020309 A1 | 2/2013 |
| WO | 2013075810 A1 | 5/2013 |
| WO | 2014072038 A1 | 5/2014 |
| WO | 2014098966 A1 | 6/2014 |
| WO | 2014131518 A1 | 9/2014 |
| WO | 2014139666 A1 | 9/2014 |
| WO | 2014139674 A1 | 9/2014 |
| WO | 2015057216 A1 | 4/2015 |
| WO | 2015176820 A1 | 11/2015 |
| WO | 2015176821 A1 | 11/2015 |
| WO | 2016043779 A1 | 3/2016 |
| WO | 2016137732 A1 | 9/2016 |
| WO | 2017025542 A1 | 2/2017 |
| WO | 2017025552 A1 | 2/2017 |
| WO | 2017029167 A1 | 2/2017 |

OTHER PUBLICATIONS

Kä Stner, M.; Office Action in EP Patent Application 19219345.6; pp. 1-9; dated May 4, 2020, European Patent ffice, 80298, Munich, Germany.

* cited by examiner

COMPONENT CARRIER HAVING A COMPONENT SHIELDING AND METHOD OF MANUFACTURING THE SAME

CROSS-REFERENCE TO RELATED APPLICATION

This application claims the benefit of the filing date of the Chinese patent application no. 201811591034.7 filed on Dec. 25, 2018, which is incorporated herein by reference in its entirety.

TECHNICAL FIELD

Embodiments of the invention relate to a component carrier and a method of manufacturing the same.

TECHNOLOGICAL BACKGROUND

A conventional component carrier comprises a stack having one or more electrically conductive layer structures and one or more electrically insulating layer structures, and a component which is embedded in the stack. The component can be an active or a passive component. For example, U.S. Pat. No. 5,734,555 A describes an electronic package for an integrated circuit (IC). The package has a plurality of first pins extending from a laminated plastic/printed circuit board substrate. The pins are coupled to the integrated circuit and provide a means for mounting the package to an external printed circuit board. The package also has an internal circuit board that is coupled to both the substrate and the IC by a plurality of second pins. Mounted to the circuit board are passive and/or active electrical elements that are connected to the integrated circuit through the second pins. Some of the second pins may extend entirely through the substrate to directly couple the internal circuit board and electrical elements to the external printed circuit board. To improve the thermal impedance of the package, the integrated circuit is mounted to a heat slug which can be attached to a heat sink. The heat sink may also provide a substrate for the internal circuit board.

SUMMARY

There is a need to provide a component carrier and a method of manufacturing the same, by which the thermal dissipation is enhanced.

This need may be met by a component carrier and a method of manufacturing the same according to the independent claims.

According to an exemplary embodiment of the invention, a component carrier is provided. The component carrier comprises a stack comprising at least one electrically conductive layer structure and/or at least one electrically insulating layer structure, and a component embedded in the stack. Sidewalls of the component are directly covered with an electrically conductive layer. In an embodiment, all sidewalls of the component are directly covered with an electrically conductive layer.

According to another exemplary embodiment of the invention, a method of manufacturing a component carrier includes the following steps: forming a stack comprising at least one electrically conductive layer structure and/or at least one electrically insulating layer structure; embedding a component in the stack; and directly covering sidewalls of the component with an electrically conductive layer.

OVERVIEW OF EMBODIMENTS

In the context of the present invention, the term "electrically conductive" does not necessarily mean that electricity actually flows in the electrically conductive layer. The term "electrically conductive" rather means that the electrically conductive layer is made of a material which has a suitability to conduct an electric current. For example, the electrically conductive layer can exclusively be a thermal layer which transfers heat without carrying any electric current. The material of the electrically conductive layer can be copper. Alternatively, nickel, aluminum, silver and gold can be used.

In the context of the present invention, the term "sidewall" means a wall of the component which is substantially perpendicularly orientated to main surfaces of the component. The main surface can include or be a top surface or a bottom surface of the component. The top surface of the component can be that surface of the component, where contacts of the component are arranged. For example, if the component has a cuboid shape, the same has one top surface, one bottom surface being opposed to the top surface, and four sidewalls at four sides of the component, wherein the sidewalls connect the top and bottom surfaces, respectively.

It is possible but not necessary that the sidewalls are completely covered by the electrically conductive layer. The sidewalls can at least partly be covered by the electrically conductive layer.

The electrically conductive layer, which can be a copper layer, is placed onto the component, which can be a die, so that the thermal characteristics and moreover a good EMI shielding (electromagnetic interference shielding) can be achieved. If all sidewalls of the component are directly covered with an electrically conductive layer, the thermal dissipation and the EMI shielding effect can be maximized.

The electrically conductive layer can also achieve a flat component carrier having a good stiffness. Thereby, warping of the component carrier can be avoided.

According to another exemplary embodiment of the invention, a method of manufacturing a component carrier is provided. The method comprises steps of forming a stack comprising at least one electrically conductive layer structure and/or at least one electrically insulating layer structure, embed-ding a component in the stack, and directly covering sidewalls of the component with an electrically conductive layer. The method achieves the same advantages like the above described component carrier.

In the following, further exemplary embodiments of the present invention will be explained.

In an embodiment, the electrically conductive layer substantially has a constant thickness. In the context of the present invention, the term "constant thickness" means that a variation in the thickness of the electrically conductive layer is preferably in a range smaller than 20%, more preferred in a range smaller than 10% and most preferred in a range smaller than 5%.

In an embodiment, the electrically conductive layer also covers, in particular directly, one or two main surfaces of the component. In the context of the present invention, the term "main surface" can include or be a top surface and a bottom surface of the component. For example, a main surface can be that surface of the component where the contacts of the component are arranged, or a main surface can be that surface of the component which is in parallel to a main surface of the component carrier.

For example, only one of the top and bottom surfaces of the component can be covered by the electrically conductive layer. Alternatively, both of the top and bottom surfaces of the component can be covered by the electrically conductive layer. By covering at least one main surface of the component, a further improved EMI shielding of the component can be achieved. In particular when both of the top and bottom surfaces of the component are covered by the electrically conductive layer, a kind of shielding cage is provided to surround the component.

In an embodiment, an electrically insulating structure is at least partly applied onto the electrically conductive layer and an electrically conductive structure is at least partly applied on the electrically insulating structure, and a thermally conductive and electrically insulating structure is arranged between the electrically conductive layer and the electrically conductive structure.

In an embodiment, a portion of electrically conductive layer covering the main surface of the component is thermally coupled to an exterior surface of the component carrier by at least one thermal via, in particular an array of thermal vias. The thermal vias of the array can optionally be connected by a metal layer which extends in parallel to the exterior surface of the component carrier. By the array of thermal vias and optionally by the metal layer, the thermal dissipation is remarkably enhanced.

In an embodiment, an electrically insulating structure is at least partly applied onto the electrically conductive layer and the at least one thermal via, and a thermally conductive and electrically insulating structure is arranged to cover at least partly the at least one thermal via.

In an embodiment, the electrically conductive layer is at least one of a thermal layer and a shielding layer. Since the electrically conductive layer functions as the thermal layer, the same is usually formed of a material in a thickness, which allows sufficient heat transfer. One the one hand, it is not necessary that electricity is actually conducted through the electrically conductive layer. On the other hand, the electrically conductive layer may have a double function to conduct heat and electricity as well. The shielding layer may exhibit an EMI shielding effect which can be measured by a damping of electromagnetic radiation.

In an embodiment, the component is a naked semiconductor chip. Thereby, the electrically conductive layer can be formed by sputtering, for example. In the context of the present invention, the term "naked semiconductor chip" means that an outer surface of the semiconductor chip consists of or is a semiconductor material, for example silicon or gallium.

In an embodiment, the component is a semiconductor chip including a surface portion coated by a dielectric. Due to the coated surface portion, the electrically conductive layer can then be formed by forming a seed layer and subsequently plating, i.e. the plating is performed on the seed layer. The seed layer has a low thickness but improves the adhesion of the subsequent plating layer to the component. The plating layer usually has a much larger thickness than the seed layer.

In an embodiment, the component includes a plasma treated surface portion. Thereby, component surface is activated and its adhesion is enhanced, in particular when the component is a naked semiconductor chip.

In an embodiment, a portion of the stack above the embedded component forms a redistribution structure so that the component carrier has a function of an adapter. Moreover, an excellent fan-out can be achieved.

In the context of the present invention, the term "above the embedded component" may refer to a portion outside the component and adjacent a surface of the component, where the contacts of the component are arranged. For example, that surface of the component can be the top surface of the component.

In an embodiment, the component carrier comprising at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment, the electrically conductive layer consists of at least two metal layers, in particular a sputtered layer and a galvanic layer. The sputtered layer enables an excellent coupling between the galvanic layer and the component.

In an embodiment of the method, the sidewalls of the component are directly covered with the electrically conductive layer substantially having a constant thickness.

In an embodiment of the method, also one or two main surfaces of the component are, in particular directly, covered by the electrically conductive layer. The main surfaces can either be the top or the bottom surface of the component.

In an embodiment of the method, a portion of electrically conductive layer covering the main surface of the component is thermally coupled to an exterior surface of the component carrier by at least one thermal via, in particular an array of thermal vias, so that the thermal dissipation is further enhanced.

In an embodiment of the method, the electrically conductive layer is formed at least as one of a thermal layer and a shielding layer so that a good heat dissipation and/or a good EMI shielding characteristic can be achieved.

In an embodiment of the method, the electrically conductive layer is formed by sputtering. This is particularly useful when the component is a naked semiconductor chip, i.e. the outer surfaces thereof are made of a semiconductor material such as silicon or gallium, etc.

In an embodiment of the method, the electrically conductive layer is formed by forming a seed layer, in particular by sputtering, and subsequently plating, in particular by galvanic plating. This is particularly useful when the component is a semiconductor chip including a surface portion coated by a dielectric.

In an embodiment of the method, a surface portion of the component is treated by plasma. Thereby, the components surface is activated to enhance the adhesion. This is particularly useful when the component is a naked semiconductor chip, i.e. the outer surfaces thereof are made of a semiconductor material such as silicon or gallium, etc.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon is a registered mark of The Chemours Company FC, LLC of Wilmington, Delware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferromagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is depending on temperature and time, an exemplary embodiment uses the surface of a support (which may be rigid or flexible) or a PCB elements (such as cores, prepregs, copper foils, etc.), that exhibits, thanks to the nano- and/or microstructures, van der Waals attraction forces, a gecko effect, a high grip, and that is dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
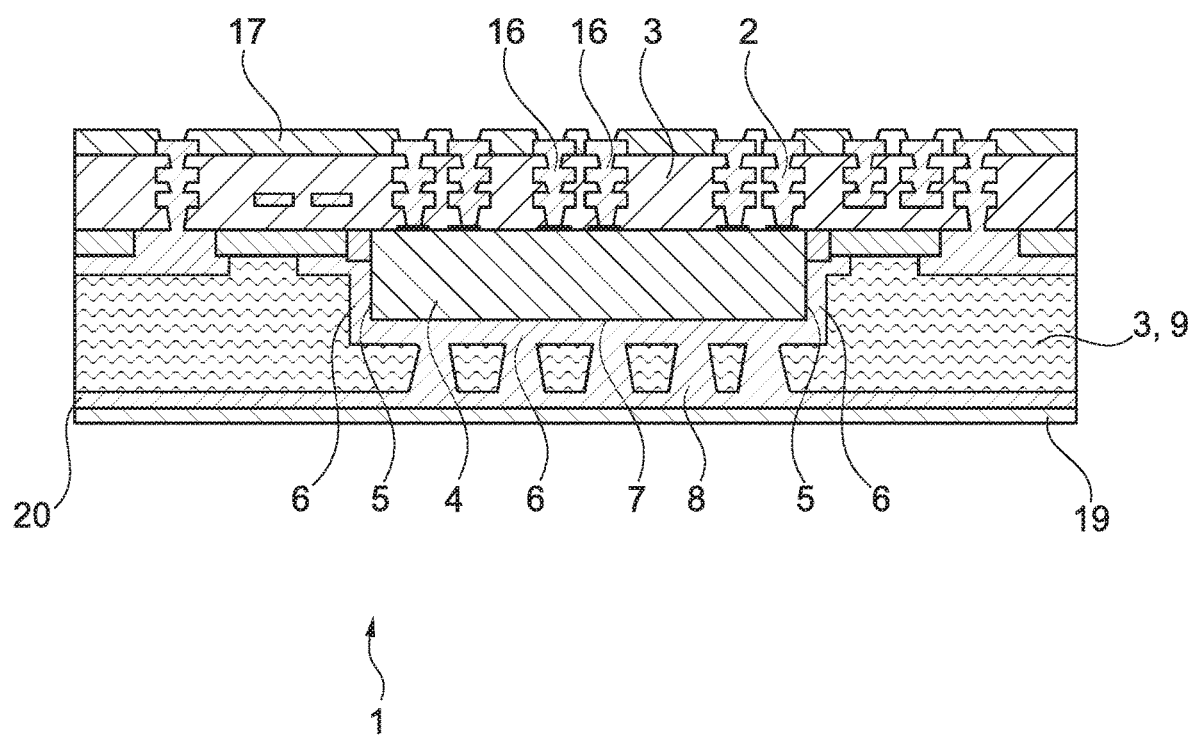
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 is shaped as a plate. The component carrier 1 can be configured as one of the group consisting of a printed circuit board, a substrate, and an interposer. The component carrier 1 can be configured as a laminate-type component carrier.

The component carrier 1 comprises a stack comprising a plurality of electrically conductive layer structures 2 and a plurality of electrically insulating layer structures 3.

The electrically conductive layer structures 2 of the component carrier 1 can comprise at least one of the group consisting of copper, aluminum, nickel, silver, gold, palladium, and tungsten, any of the mentioned materials being optionally coated with supra-conductive material such as graphene.

The electrically conductive layer structures 2 of the component carrier 1 include electrical vias 16 which are connected to contacts of the component 4.

The electrically insulating layer structures 3 comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

A component 4 is embedded in the stack. The component 4 is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

All four sidewalls 5 of the component 4 are at least partly and directly covered with an electrically conductive layer 6. The electrically conductive layer 6 forms a kind of electromagnetic cage surrounding the component 4.

In the context of the present invention, the term "electrically conductive" does not necessarily mean that electricity actually flows in that layer 6. The term "electrically conductive" rather means that the layer 6 is made of a material which has a suitability to conduct an electric current. For example, the electrically conductive layer 6 can exclusively be a thermal layer 6 which transfers heat without carrying any electric current. The material of the electrically conductive layer 6 can be copper. Alternatively, nickel, aluminum, silver and gold can be used for the electrically conductive layer 6.

In the context of the present invention, the term "sidewall" means a wall of the component 4 which is substantially perpendicularly orientated to main surfaces of the component. The main surface can include or be the top surface or the bottom surface 7 of the component 4. The top surface of the component 4 can be that surface of the component, where contacts of the component 4 are arranged. Alternatively, the main surface can be that surface of the component 4 which is parallel to a main surface of the component carrier 1. For example, if the component 4 substantially has a cuboid shape, the same has one top surface, one bottom surface 7 being opposed to the top surface, and four sidewalls 5 at four sides of the component 4, wherein the sidewalls 5 connect the top and bottom surfaces, respectively. The number of the sidewalls 5 is not limited to four, in particular in case of a hexagonal or octagonal-shaped main surfaces of the component 4.

Although all sidewalls 5 of the component 4 are directly covered with an electrically conductive layer 6 in the embodiment of FIG. 1, it is conceivable that only some of the sidewalls 5 are directly covered with an electrically conductive layer 6.

The electrically conductive layer 6 substantially has a constant thickness. In the context of the present invention, the term "constant thickness" means that a variation in the thickness of the electrically conductive layer 6 is preferably in a range smaller than 20%, more preferred in a range smaller than 10% and most preferred in a range smaller than 5%.

The electrically conductive layer 6 has a relatively large thickness which ensures that the relative flat component carrier 1 has a good stiffness. Thereby, warping of the component carrier 1 can be minimized.

The electrically conductive layer 6 also covers one main surface 7 of the component 4. In the context of the present invention, the term "main surface" can include a top surface and a bottom surface of the component 4. In an embodiment, only one of the top and bottom surfaces of the component 4 is covered by the electrically conductive layer 6. For example, in FIG. 1 only the bottom surface 7 of the component 4 is covered by the electrically conductive layer 6. In another embodiment, both of the top and bottom surfaces of the component 4 can be covered by the electrically conductive layer 6. By covering at least one main surface 7 of the component 4, a further improved EMI shielding (electromagnetic interference shielding) of the component 4 can be achieved. If both of the top and bottom surfaces of the component 4 are covered by the electrically conductive layer 6, a kind of electromagnetic cage is provided around the component 4. Furthermore, the heat dissipation and the stiffness of the component carrier 1 are further improved.

A portion of electrically conductive layer 6 covering the main surface 7 of the component 4 is thermally coupled to an exterior surface of the component carrier 1 by an array of thermal vias 8. At the same time, the electrically conductive layer 6 is a thermal layer to further improve the thermal dissipation. Since the electrically conductive layer 6 functions as the thermal layer, the same is usually formed of a material in a thickness, which allows sufficient heat transfer. One the one hand, it is not necessary that electricity is actually conducted through the electrically conductive layer 6. One the other hand, the electrically conductive layer 6 may have a double function to conduct heat and electricity as well.

In an embodiment, the component 4 is a naked semiconductor chip. Thereby, the electrically conductive layer 6 can particularly be formed by sputtering. In the context of the present invention, the term "naked semiconductor chip" means that an outer surface of the semiconductor chip consists of or is a semiconductor material, for example silicon or gallium.

In another embodiment, the component 4 is a semiconductor chip including a surface portion coated by a dielectric. In this case, the electrically conductive layer 6 can be formed by forming a seed layer and subsequently plating. The seed layer has a lower thickness but improves the adhesion of the subsequent plating layer to the component 4. The plating layer usually has a much larger thickness than the seed layer.

To activate the surface of the component 4, at least a portion of the same can be treated by plasma.

Although not shown in FIG. 1, a portion of the stack above the embedded component 4 can form a redistribution structure. For example, a pitch between contacts of the component 4 can be larger or smaller than a pitch of external contacts of the component carrier 1. In the context of the present invention, the term "above the embedded component 4" may refer to a portion outside the component 4 and adjacent a surface of the component 4, where the contacts of the component are arranged. For example, that surface of the component 4 can be the top surface of the component 4.

A solder resist 17 and a surface finish 19 are applied on the stack. The solder resist 17 is applied to that surface of the stack, where the contacts of the component carrier 1 are exposed, and the surface finish 19 is applied to the opposed surface of the stack.

Figure 2:
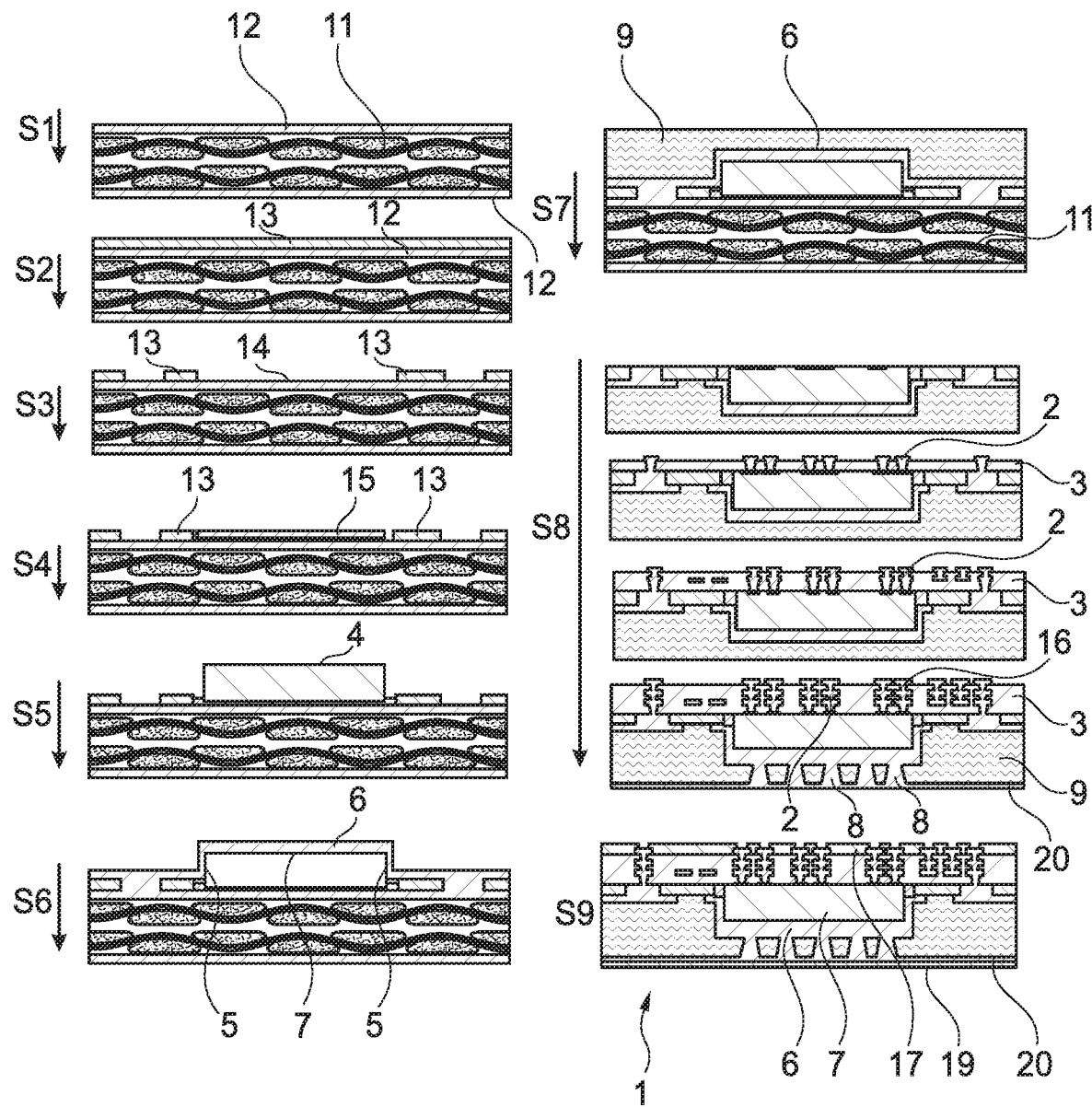
FIG. 2 illustrates a method of manufacturing a component carrier according to an exemplary embodiment of the invention.

FIG. 2 illustrates a method of manufacturing a component carrier 1 according to an exemplary embodiment of the invention.

In a step S1, a temporary carrier 11 is provided. The temporary carrier 11 can comprise a DCF (Detachable Copper Foil) core or a glass carrier. The temporary carrier 11 is laminated at both sides by a detachable copper foil 12.

In a step S2, a patterning material 13 is applied on one or on both copper foils 12. The patterning material 13 can be a PSR (photosensitive resist) or a PID (photo-imageable dielectric), etc.

In a step S3, patterning material 13 is patterned. In an embodiment, the patterning can comprise illumination or exposing with electromagnetic radiation through a mask, followed by developing the patterning material 13, followed in turn by a selective removal of either the illuminated portion or the non-illuminated portion of the patterning material 13. The removal can be achieved by an etching chemistry. In step S3, a cavity 14 is formed which is configured to accommodate the component 4.

In a step S4, an adhesive 15 is applied in the cavity 14. The adhesive 15 can be an electrically non-conductive adhesive. The adhesive 15 can be applied by printing. The adhesive 15 can be applied by other application methods. For example, the adhesive 15 can be printed or sprayed as a film, or the adhesive 15 can be placed into cavity 14 as a pad or a tape. Also, instead of applying the adhesive 15 into the cavity 14, the adhesive 15 can be applied to one surface of the component 4 before the component 4 having the adhesive 15 applied thereon is placed into the cavity 14.

In a step S5, the component 4 is placed into the cavity 14 and adhered by the adhesive 15. The adhesive 15 can be a thermosetting adhesive which is to be cured.

In a step S6, the sidewalls 5 and also a bottom surface 7 of the component 4 are directly covered with an electrically conductive layer 6 substantially having a constant thickness. In an embodiment, the electrically conductive layer 6 is formed by sputtering, in particular when the component 4 is a naked semiconductor chip. In another embodiment, the electrically conductive layer 6 is formed by forming a seed layer and subsequently by plating, i.e. the plating is performed on the seed layer which has been formed before. This two-step procedure is applicable when the component 4 is a semiconductor chip including a surface portion coated by a dielectric. The seed layer can be formed by electroless plating or sputtering. The subsequent plating can be made by galvanic plating for example. A thickness of that part of the electrically conductive layer 6, which is made by plating, is usually larger than a thickness of the seed layer of the electrically conductive layer 6. The material of the electrically conductive layer 6 can be copper.

Before applying the electrically conductive layer 6, a surface portion of the component 4 can be treated by plasma. For example, if the component 4 is a naked semiconductor chip, the outer semiconductor chip surface is activated by the plasma treatment.

In a step S7, the electrically conductive layer 6 is oxidized so that the surface roughness thereof and/or the electric resistance thereof is enlarged. After that, a filling material 9 is applied onto the electrically conductive layer 6. Thereby, the component carrier 1 is flattened. The filling material 9 can be a dielectric material, a prepreg material, an insulating material such as a build-up-material, in particular build-up-film, or a mold film, etc.

In FIG. 2, the steps S1 to S7 are performed on only one side of the temporary carrier 11. It is to be noted that the steps S1 to S7 can also be performed on the opposed side of the temporary carrier 11.

In a step S8, the temporary carrier 11 is detached or delaminated. The detachable copper foils 12 can remain on the stack. Thereafter, a patterning and plating process is performed in which several layers of electrically conductive layer structures 2 and electrically insulating layer structures 3 are build-up on one or both sides of the stack. In particular, on that side of the stack where the contacts of the component 4 are arranged, electrically conductive vias 16 are formed which connect the contacts of the component 4 to the external contacts of the component carrier 1. For example, a portion of the stack above the embedded component 4, i.e. a portion of the electrically conductive layer structures 2 and electrically insulating layer structures 3, can form a redistribution structure, where a pitch between contacts of the component 4 is larger or smaller than a pitch of external contacts of the component carrier 1.

On the opposed side of the stack, where the contacts of the component 4 are not arranged, the filling material 9 is patterned and plated so that a portion of the electrically conductive layer 6 covering the main surface 7 of the component 4 is thermally coupled to an exterior surface of the component carrier 1 by an array of thermal vias 8. In particular, a copper layer 20, which extends in parallel to the exterior surface of the component carrier 1, connects the array of vias 8.

In a step S9, a solder resist 17 and a surface finish 19 is applied on the stack. For example, the solder resist 17 can be applied to that surface of the stack, where the contacts of the component carrier 1 are exposed, and the surface finish 19 can be applied to the opposed surface of the stack, for example on the copper layer 20.

Eventually, the method includes steps of forming a stack comprising at least one electrically conductive layer structure 2 and/or at least one electrically insulating layer structure 3, embedding a component 4 in the stack and directly covering sidewalls 5 of the component 4 with an electrically conductive layer 6.

Figure 3:
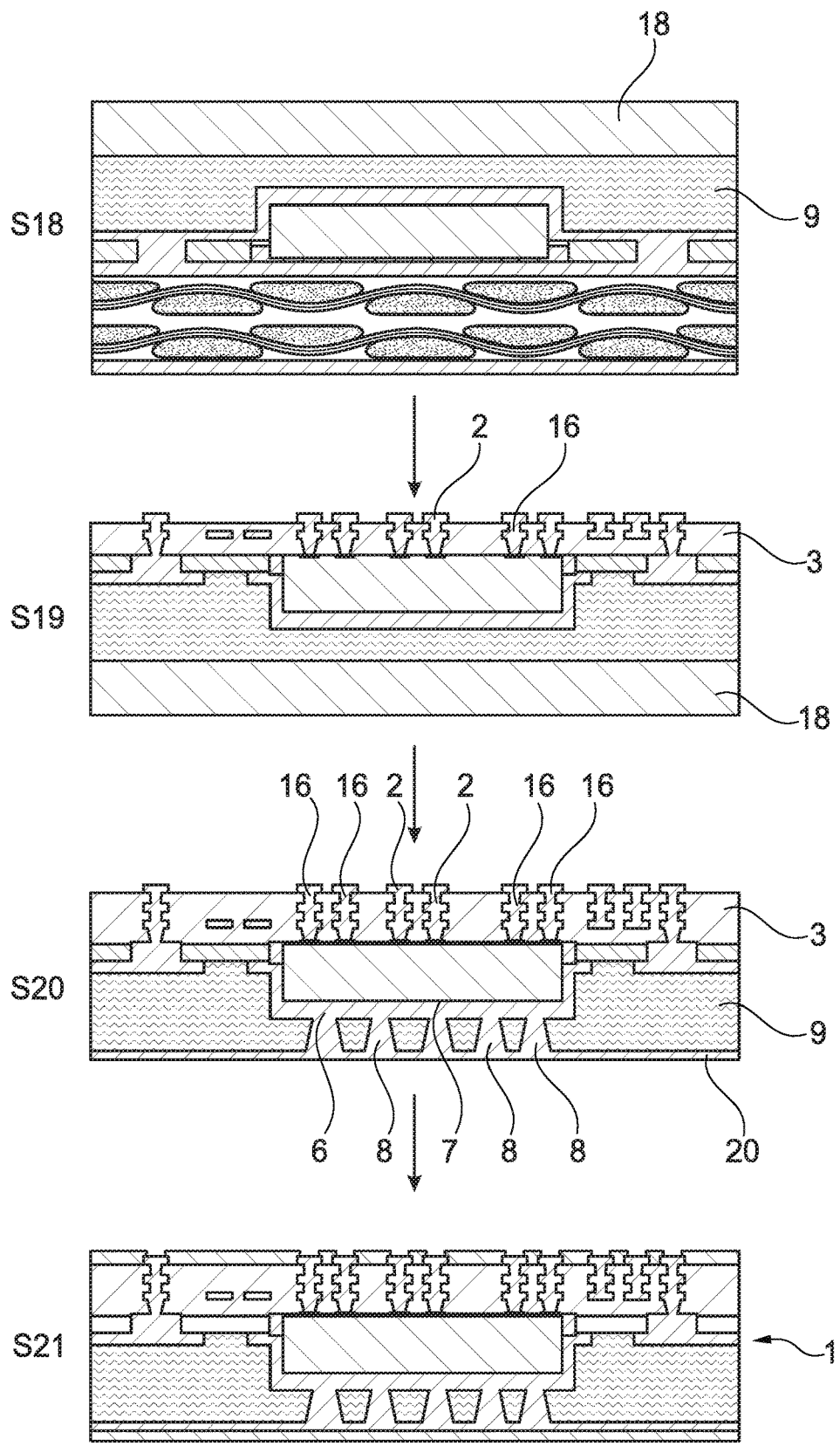
FIG. 3 illustrates a modification of the method of manufacturing a component carrier of FIG. 2 according to another exemplary embodiment of the invention.

FIG. 3 illustrates a modification of the method of manufacturing a component carrier 1 of FIG. 2 according to another exemplary embodiment of the invention. The embodiment of FIG. 3 replaces the steps S8 and S9 of FIG. 2 with modified steps S18 to S21.

In the step S18, which follows step S7 in FIG. 2, a second temporary carrier 18 is applied on the filling material 9. The second temporary carrier 18 is applied before curing the filling material 9, which can be a dielectric material, a prepreg material, an insulating material such as a build-up-material, in particular a build-up-film, or a mold film. The second temporary carrier 18 improves the stiffness of the temporary component carrier 1 which can be readily aligned during the subsequent manufacturing process and exhibits less warpage.

In the step S19, the (first) temporary carrier 11 is detached or delaminated, and a first patterning and plating process is performed in which several layers of electrically conductive layer structures 2 and electrically insulating layer structures 3 are build-up on that side of the stack where the contacts of the component 4 are arranged. In particular, electrically conductive vias 16 are formed which are connected to the contacts of the component 4.

In a step S20, the second temporary carrier 18 is detached or delaminated, and a second patterning and plating process is performed, in which several electrically conductive layer structures 2 and electrically insulating layer structures 3 are build-up on that side of the stack where the contacts of the component 4 are arranged. In particular, the electrically conductive vias 16 are further built-up. It is to be noted that the second patterning and plating process can be omitted.

Furthermore, on the opposed side of the stack where the contacts of the component 4 are not arranged, a third patterning and plating process is performed in which the filling material 9 is patterned and plated so that a portion of the electrically conductive layer 6 covering the main surface 7 of the component 4 is thermally coupled to an exterior surface of the component carrier 1 by an array of thermal vias 8. In particular, a copper layer 20, which extends in parallel to the exterior surface of the component carrier 1, is plated to connect the array of vias 8.

In a step S21, a solder resist 17 and a surface finish 19 is applied on the stack. For example, the solder resist 17 can be applied to that surface of the stack, where the contacts of the component carrier 1 are exposed, and the surface finish 19 can be applied to the opposed surface of the stack, for example on the copper layer 20 which extends in parallel to the exterior surface of the component carrier 1.

Figure 4:
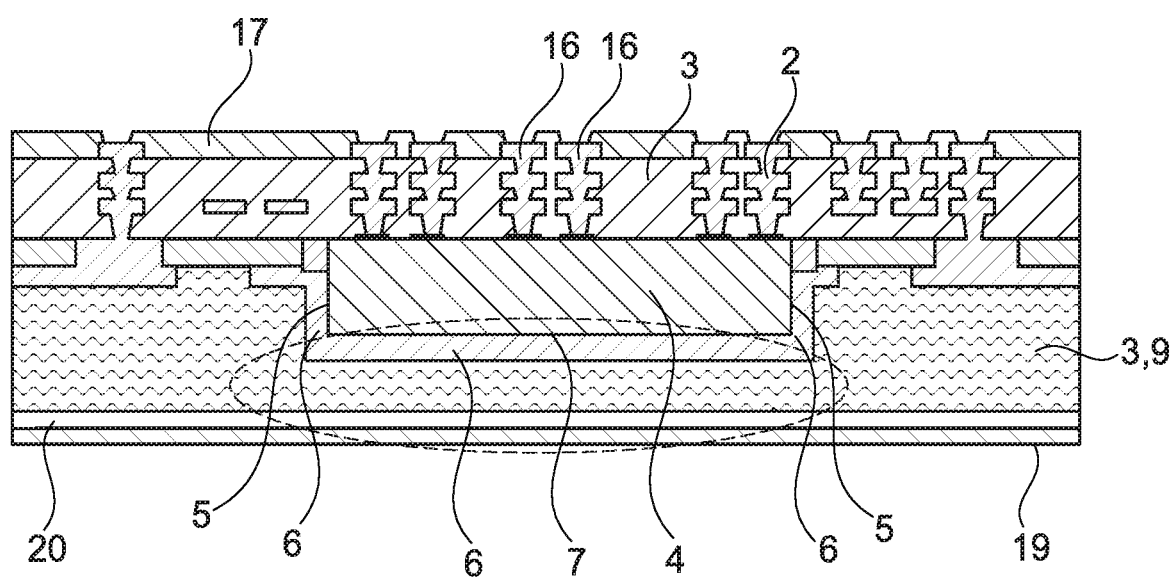
FIG. 4 illustrates a cross-sectional view of a component carrier according to an exemplary embodiment of the invention.

FIG. 4 illustrates a cross-sectional view of a component carrier 1 according to an exemplary embodiment of the invention. The component carrier 1 of FIG. 4 is substantially similar to the component carrier 1 of FIG. 1 except for the following differences.

While the component carrier 1 of FIG. 1 comprises the thermal vias 8 for a heat dissipation from the component 4, the component carrier 1 of FIG. 4 does not need this kind of heat dissipation so that the thermal vias 8 are omitted in the component carrier 1 of FIG. 4. Consequently, also the holes are omitted which define the thermal vias 8. Instead, the filling material 9, which is one of the plurality of electrically insulating layer structures 3, also covers the electrically conductive layer 6 at the side of the bottom surface 7 of the component 4. Furthermore, the copper layer 20 can have the shape of a planar layer and is thermally connected and/or electrically not connected to the electrically conductive layer 6.

Figure 5:
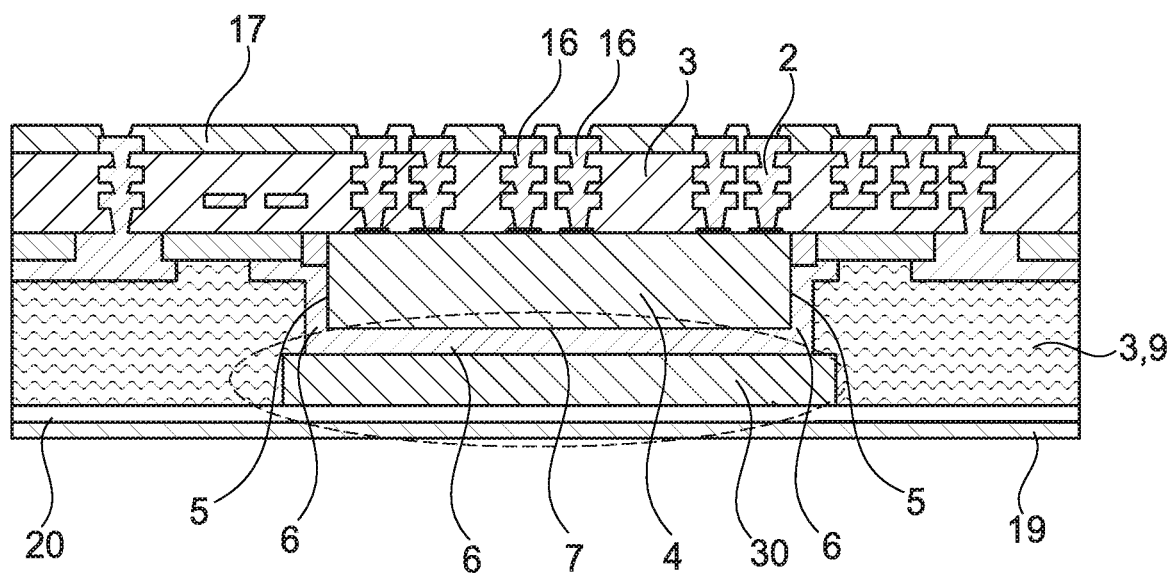
FIG. 5 illustrates a cross-sectional view of a component carrier according to an exemplary embodiment of the invention.

FIG. 5 illustrates a cross-sectional view of a component carrier 1 according to an exemplary embodiment of the invention. The component carrier 1 of FIG. 5 is substantially similar to the component carrier 1 of FIG. 4 except for the following differences.

Between the copper layer 20 and the electrically conductive layer 6 at the side of the bottom surface 7 of the component 4, a thermally conductive structure 30 is arranged. The thermally conductive structure 30 can have a shape of a block as shown in FIG. 5 or of a planar layer (not shown). The thermally conductive structure 30 can be an inlay. The thermally conductive structure 30 can be made of a metal such as copper or aluminum, or of a thermally conductive but electrically insulating material such as ceramics or a dielectric.

Figure 6:
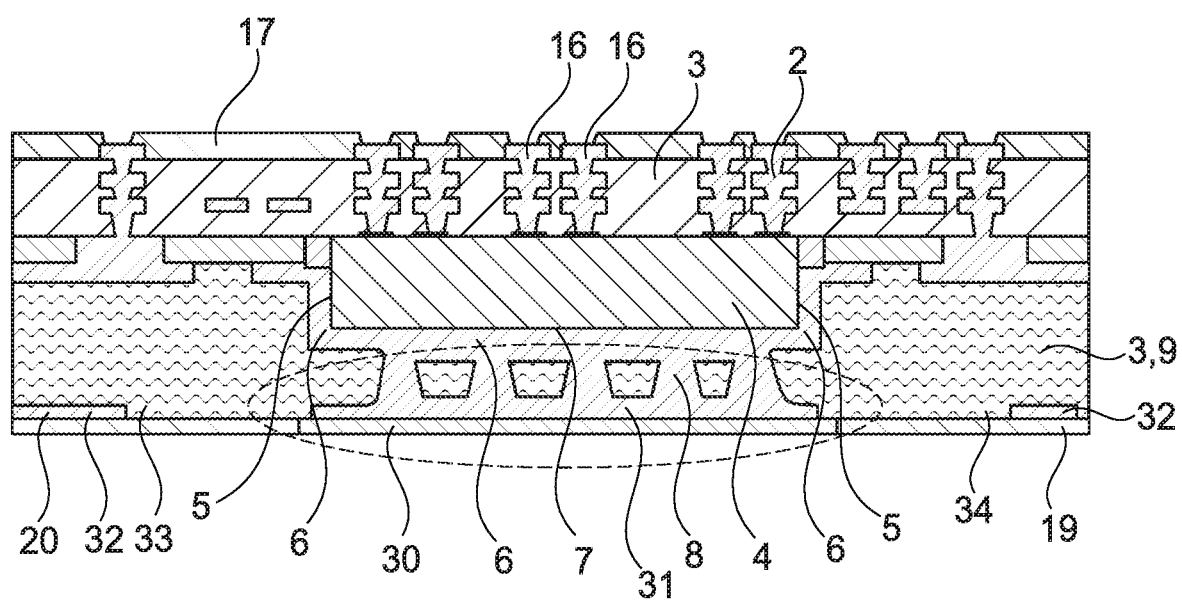
FIG. 6 illustrates a cross-sectional view of a component carrier according to an exemplary embodiment of the invention.

FIG. 6 illustrates a cross-sectional view of a component carrier 1 according to an exemplary embodiment of the invention. The component carrier 1 of FIG. 6 is substantially similar to the component carrier 1 of FIG. 1 except for the following differences.

The copper layer 20 is electrically insulated from the electrically conductive layer 6 at the side of the bottom surface 7 of the component 4 in that the copper layer 20 is arranged in a manner that a first portion 31 of the copper layer 20 is formed which is electrically and thermally connected to the array of thermal vias 8, and a second portion 32 and a third portion 33 of the copper layer 20 are formed, which are electrically not connected to the first portion 31. The gaps 32, 33 therebetween are filled by the filling material 9 such as a dielectric material, a prepreg material, an insulating material such as a build-up-material, in particular build-up-film, or a mold film, etc., or by another insulating material which is different from the filling material 9. The gaps 32, 33 can be formed by photolithography and etching methods, or by drilling of the copper layer 20.

Figure 7:
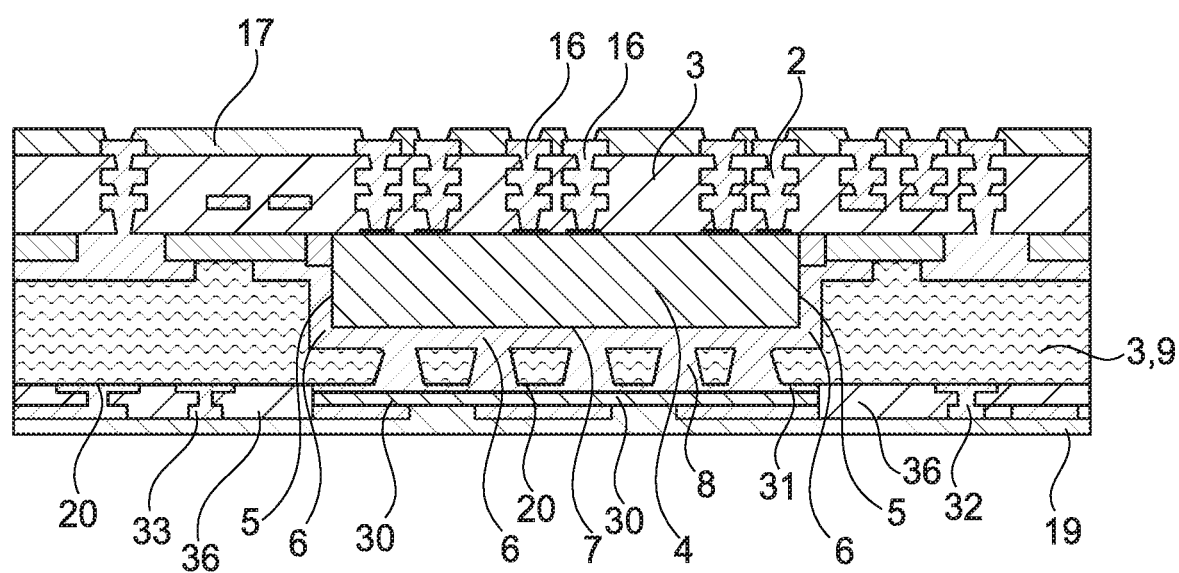
FIG. 7 illustrates a cross-sectional view of a component carrier according to an exemplary embodiment of the invention.

FIG. 7 illustrates a cross-sectional view of a component carrier 1 according to an exemplary embodiment of the invention. The component carrier 1 of FIG. 7 is substantially similar to the component carrier 1 of FIG. 1 except for the following differences.

The copper layer 20 is patterned, for example by photolithography and etching methods, or by drilling. Thereby, a first portion 31 of the copper layer 20 is formed which is electrically and thermally connected to the array of thermal vias 8, and a second portion 32 and a third portion 33 of the copper layer 20 are formed, which are electrically not connected to the first portion 31. The gaps therebetween are filled by an electrically insulating material 36 such as a dielectric material, a prepreg material, an insulating material such as a build-up-material, in particular build-up-film, or a mold film, etc. In addition, a thermally conductive structure 30 is arranged on first portion 31. The thermally conductive structure 30 can have a shape of a block as shown in FIG. 7 or of a planar layer (not shown). The thermally conductive structure 30 can be an inlay. The thermally conductive structure 30 can be made of a metal such as copper or aluminum, or of a thermally conductive but electrically insulating material such as ceramics or a dielectric. Further build-up layers, preferably patterned layers can be arranged on the first to third portions 31, 32, 33 of the copper layer 20 and on the thermally conductive structure 30.

Figure 8:
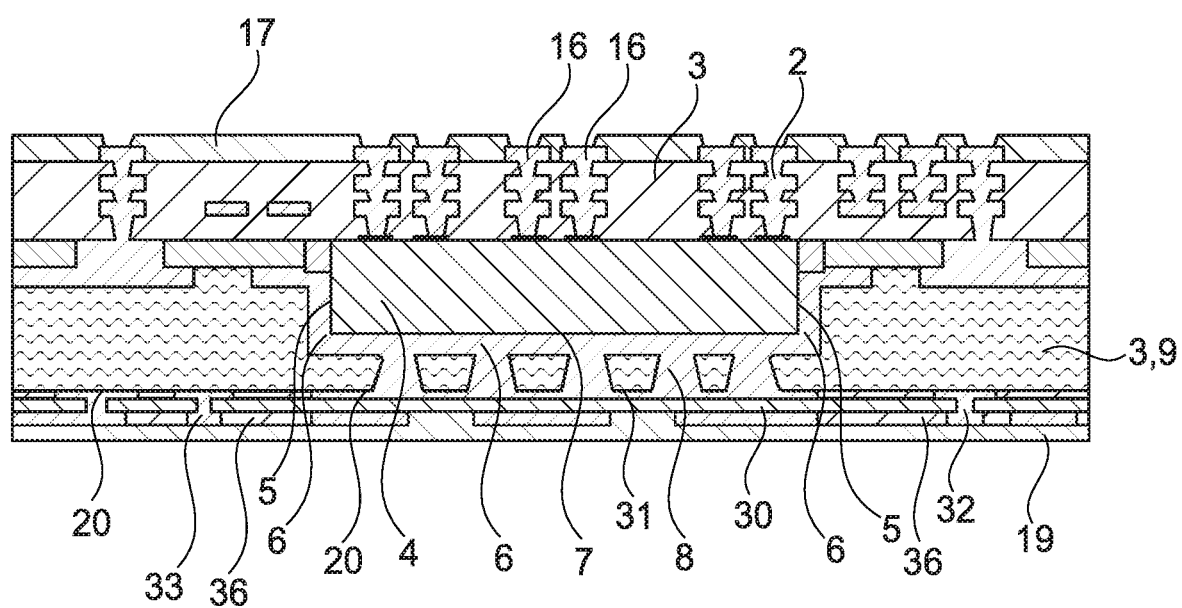
FIG. 8 illustrates a cross-sectional view of a component carrier according to an exemplary embodiment of the invention.

FIG. 8 illustrates a cross-sectional view of a component carrier 1 according to an exemplary embodiment of the invention. The component carrier 1 of FIG. 8 is substantially similar to the component carrier 1 of FIG. 7 except for the following differences. The thermally conductive structure 30 horizontally extends beyond the first portion 31 so that the thermally conductive structure 30 horizontally extends to the above-mentioned electrically insulating material 36 and furthermore to the second and third portions 32, 33 of the copper layer 20.

In the embodiments of FIGS. 5 to 8, the electrical insulation between the copper layer 20 and the electrically conductive layer 6 at the side of the bottom surface 7 of the component 4 allows a higher degree of freedom in designing the component carrier 1.

A further aspect of the present invention relates to a method of manufacturing a component carrier 1, wherein the method comprises the following steps: forming a stack comprising at least one electrically conductive layer structure 2 and/or at least one electrically insulating layer structure 3; embedding a component 4 in the stack; and directly covering sidewalls 5 of the component 4 with an electrically conductive layer 6.

In an embodiment of the method, the sidewalls 5 of the component 4 are directly covered with the electrically conductive layer substantially having a constant thickness.

In an embodiment of the method, also one or two main surfaces 7 of the component 4 are, in particular directly, covered by the electrically conductive layer 6.

In an embodiment of the method, a portion of electrically conductive layer covering the main surface 7 of the component 4 is thermally coupled to an exterior surface of the component carrier 1 by at least one thermal via 8, in particular an array of thermal vias 8.

In an embodiment, the method comprising at least one of the following features; the electrically conductive layer 6 is formed at least as one of a thermal layer and a shielding layer; the electrically conductive layer 6 is formed by sputtering; the electrically conductive layer 6 is formed by forming a seed layer, in particular by sputtering, and subsequently plating, in particular by galvanic plating.

In an embodiment of the method, a surface portion of the component 4 is treated by plasma.

It should be noted that the term "comprising" does not exclude other elements or steps and the articles "a" or "an" do not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
a stack comprising at least one electrically conductive layer structure and/or at least one electrically insulating layer structure; and
a component embedded in the stack;
wherein sidewalk of the component are directly covered with an electrically conductive layer;
wherein an electrically insulating structure is at least partly applied onto the electrically conductive layer and an electrically conductive structure is at least partly applied on the electrically insulating structure, and a thermally conductive and electrically insulating structure is arranged between the electrically conductive layer and the electrically conductive structure.

2. The component carrier according to claim 1, wherein a portion of the electrically conductive layer covering the main surface of the component is thermally coupled to an exterior surface of the component carrier by at least one thermal via.

3. The component carrier according to claim 2, wherein an electrically insulating structure is at least partly applied onto the electrically conductive layer and the at least one thermal via, and a thermally conductive and electrically insulating structure is arranged to cover at least partly the at least one thermal via.

4. The component carrier according to claim 2, wherein the electrically conductive layer is at least one of a thermal layer and a shielding layer.

5. The component carrier according to claim 1, wherein the electrically conductive layer is at least one of a thermal layer and a shielding layer.

6. The component carrier according to claim 1, wherein the component is a naked semiconductor chip.

7. The component carrier according to claim 1, wherein the component is a semiconductor chip including a surface portion coated by a dielectric.

8. The component carrier according to claim 1, wherein the component includes a plasma treated surface portion.

9. The component carrier according to claim 1, wherein a portion of the stack above the embedded component forms a redistribution structure.

10. The component carrier according to claim 1, wherein the electrically conductive layer consists of at least two metal layers.

11. The component carrier according to claim 10, wherein the electrically conductive layer consists of a sputtered layer and a galvanic layer.

12. The component carrier according to claim 1, comprising at least one of the following features:
the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting, unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier comprises at least one of the group consisting of copper, aluminum, nickel, silver, gold, palladium, and tungsten, any of the mentioned materials being optionally coated with supra-conductive material;
wherein the electrically insulating layer structure comprises at least one of the group consisting of resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

13. The component carrier according to claim 1, wherein the electrically conductive layer also covers one or two main surfaces of the component.

14. The component carrier according to claim 1, wherein the electrically conductive layer substantially has a constant thickness.

15. A component carrier, comprising:
a stack comprising at least one electrically conductive layer structure and/or at least one electrically insulating layer structure; and
a component embedded in the stack;
wherein sidewalk of the component are directly covered with an electrically conductive layer; and
an electrically insulating structure is at least partly applied onto the electrically conductive layer and an electrically conductive structure is at least partly applied on the electrically insulating structure, and a thermally conductive and electrically insulating structure, which is different from the electrically insulating structure, is arranged between the electrically conductive layer and the electrically conductive structure.

* * * * *

UNITED STATES PATENT AND TRADEMARK OFFICE
CERTIFICATE OF CORRECTION

PATENT NO. : 10,897,812 B2  
APPLICATION NO. : 16/726288  
DATED : January 19, 2021  
INVENTOR(S) : Minwoo Lee Page 1 of 1

It is certified that error appears in the above-identified patent and that said Letters Patent is hereby corrected as shown below:

In the Claims

Claim 1, Column 15, Line 17, the word -sidewalk- should be changed to --sidewalls--.

Claim 15, Column 16, Line 49, the word -sidewalk- should be changed to --sidewalls--.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*